United States Patent [19]

Bjornholt

[11] Patent Number: 5,204,551

[45] Date of Patent: Apr. 20, 1993

[54] METHOD AND APPARATUS FOR HIGH POWER PULSE MODULATION

[75] Inventor: John E. Bjornholt, Mesa, Ariz.

[73] Assignee: Motorola, Inc., Schaumburg, Ill.

[21] Appl. No.: 724,256

[22] Filed: Jul. 1, 1991

[51] Int. Cl.$^5$ .......................................... H03K 3/017
[52] U.S. Cl. .................................. 307/265; 307/246; 307/253
[58] Field of Search ............... 307/265, 109, 253, 246, 307/266

[56] References Cited

U.S. PATENT DOCUMENTS

| | | | |
|---|---|---|---|
| H275 | 5/1987 | Milberger et al. .................. | 307/264 |
| 4,042,837 | 8/1977 | Nyswander ......................... | 307/265 |
| 4,924,110 | 5/1990 | Rettig et al. ....................... | 307/265 |

Primary Examiner—Robert J. Pascal
Assistant Examiner—R. A. Ratliff
Attorney, Agent, or Firm—Jeffrey D. Nehr

[57] ABSTRACT

A method and apparatus for high power pulse modulation which includes a high voltage supply to provide a high voltage input signal, and a drive channel, rise channel, fall channel, and dump channel. A timing system controls the switching of the drive channel, rise channel, fall channel, and dump channel to modulate the high voltage input signal to produce an output signal. Each channel comprises a channel logic input, buffer amplifier, alternating current (AC) coupler, isolation pulse transformer, current limiter, and switch to provide the pulse modulation. Power MOSFETs can be used as switches in the four channels.

32 Claims, 3 Drawing Sheets

METHOD AND APPARATUS FOR HIGH POWER PULSE MODULATION

BACKGROUND OF THE INVENTION

This invention relates in general to the field of pulse modulation, and in particular to high pulse repetition frequency (PRF) modulation using high power sources.

Modulators are needed in a great number of electronic systems. Pulse modulation, for example, is an integral part of driving magnetron transmitters in radar systems. The need exists in a missile seeker radar system to generate a relatively large amount of radio-frequency (RF) power to achieve required target acquisition ranges. One such program is the Active Radar Target Seeker (ARTS) program.

The ARTS program requires in a small volume a high power modulator which operates at a high PRF, high duty factor, and high efficiency. The high power modulating method needed must produce good fidelity waveforms with low inter-pulse output noise so that return pulses can be received.

A simple two-phase switch will not work in an application such as the ARTS program where a high power magnetron is to be modulated. Using one switch to connect the magnetron to a high voltage supply to generate the RF pulse and the other to clamp it to electrical ground after the pulse does not perform satisfactorily. The equivalent capacitance from components in the circuit such as a magnetron, filament supply, and metal oxide semiconductor field effect transistor (MOSFET) switch must be charged to a high voltage and then discharged every several microseconds or less. The power dissipation at such a high frequency produces a resulting modulating efficiency which is unacceptable from both a power and thermal perspective.

Similarly, a three-channel (phase) switching configuration to drive an ARTS magnetron can be constructed but does not attain the efficiency needed for an application such as the ARTS system. Previous modulator designs have typically suffered at least two major problems: (1) a high PRF does not allow enough time for the circuit to return to its initial conditions before the next pulse period (contributing to excessive noise), and (2) the efficiency of the devices have been low (less than the required minimum of about 70%).

SUMMARY OF THE INVENTION

Accordingly, it is an advantage of the present invention to provide a new and improved apparatus and method for high power pulse modulation. It is a further advantage of the present invention to provide a method and appartus to simultaneously achieve a high output power, high duty factor, high PRF, and high efficiency in pulse modulation. It is still a further advantage of the present invention to provide a method and apparatus for producing low inter-pulse noise in a pulse modulator of relatively small volume.

To achieve these advantages, a method and apparatus for high power pulse modulation is contemplated which includes a high voltage supply to provide a high voltage input signal, and a drive channel, rise channel, fall channel, and dump channel. A timing system controls the switching of the drive channel, rise channel, fall channel, and dump channel to modulate the high voltage input signal to produce an output signal.

Each channel comprises a channel logic input, buffer amplifier, alternating current (AC) coupler, isolation pulse transformer, current limiter, and switch to provide the pulse modulation. Power MOSFETs can be used as switches in the four channels.

The above and other features and advantages of the present invention will be better understood from the following detailed description taken in conjunction with the accompanying drawings.

DETAILED DESCRIPTION OF THE PREFERRED EMBODIMENT

Figure 1:
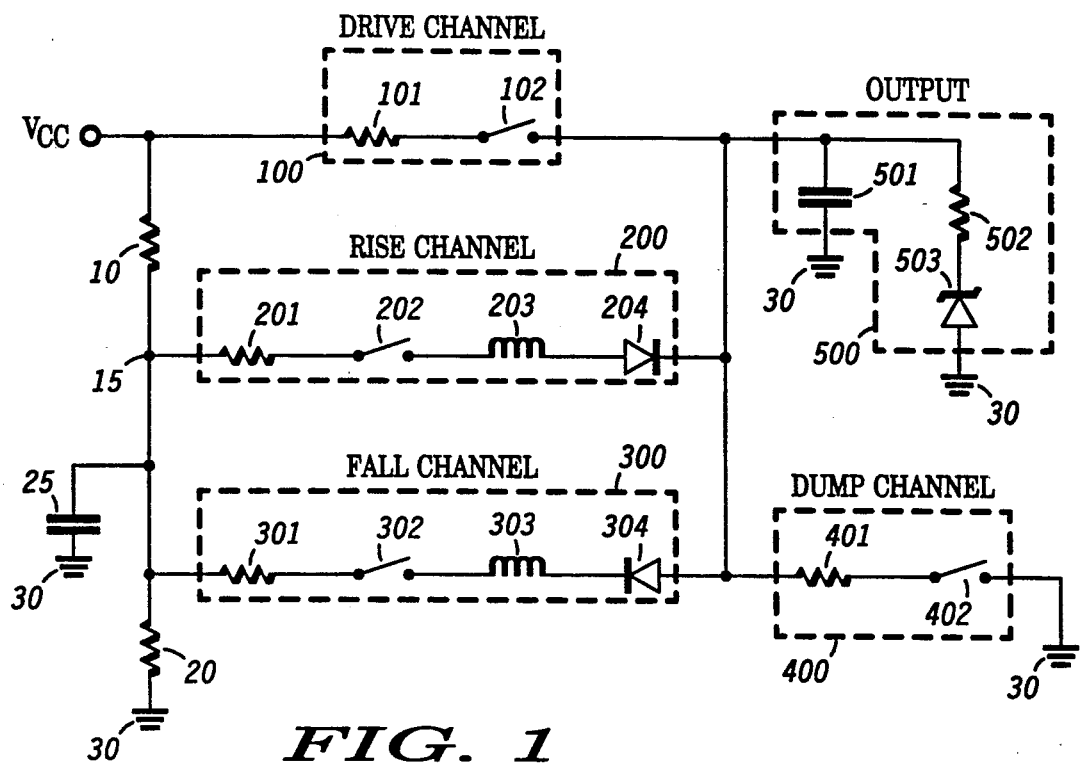
In FIG. 1 there is shown a simplified circuit schematic of a four-channel pulse modulator in accordance with a preferred embodiment of the invention.

In FIG. 1 there is shown a simplified circuit schematic for a four-channel pulse modulator. The high voltage input to the modulator is $V_{cc}$, which is connected to the drive channel 100. Rise channel 200 and fall channel 300 are connected in parallel between junctions 15 and 16.

A voltage divider represented by resistors 10 and 20 is connected between high voltage input $V_{cc}$ and electrical ground 30. Junction 15 between resistors 10 and 20 provides approximately one-half the high voltage input $V_{cc}$ to the rise channel 200 and the fall channel 300 if resistors 10 and 20 are of equal resistance value (for example 1 megohm each). Capacitor 25 is coupled between junction 15 and electrical ground 30, providing both a source and sink of energy for the rise and fall channels, respectively.

Output 500 is coupled to junction 16, which is a common connection of the drive channel 100, rise channel 200, fall channel 300, and dump channel 400. Output 500 and dump channel 400 are also coupled to electrical ground 30.

The drive channel 100, the rise channel 200, the fall channel 300, and the dump channel 400 each have individual components to provide the modulation function. Drive channel 100 has elements which can be characterized as a drive channel resistor 101 in series with a drive channel switch 102. Rise channel 200 can be characterized as a rise channel resistor 201, a rise channel switch 202, a rise channel inductor 203, and a rise channel diode 204, all in series. The rise channel diode 204 is connected with its cathode toward the output 500. Similarly, fall channel 300 can be characterized as a fall channel resistor 301, a fall channel switch 302, a fall channel inductor 303, and a fall channel diode 304, all in series. The fall channel diode is connected with its anode toward the output 500.

The output 500, representing the approximate equivalent of a magnetron load, can be characterized as an output capacitor 501 in parallel with a series combination of an output resistor 502 and zener diode 503 connected to electrical ground 30. The anode of the zener diode 503 is connected to electrical ground 30.

Figure 2:
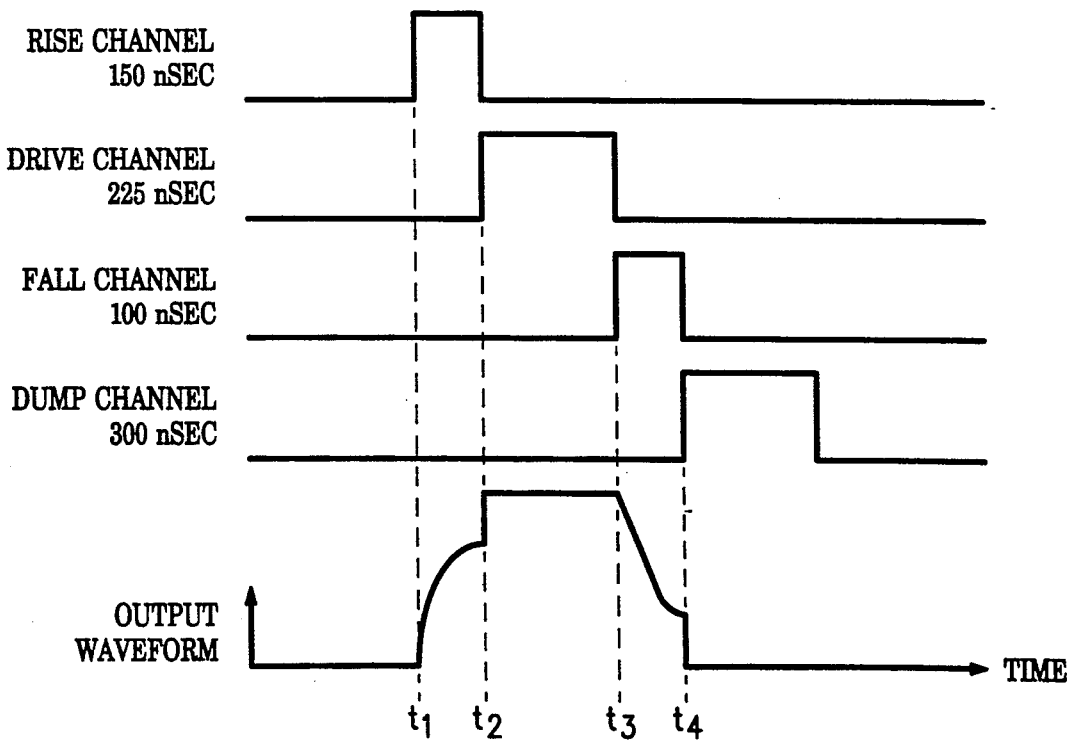
In FIG. 2 there is shown timing data for controlling the four-channel pulse modulator shown in FIG. 1.

FIG. 2 shows schematically the timing data necessary for operating the pulse modulator in FIG. 1 through one pulse modulation cycle. Separate timing data are shown as FIG. 2 for the rise channel 200, drive channel 100, fall channel 300 and dump channel 400. The timing data are used to sequentially switch rise channel switch 202, drive channel switch 102, fall channel switch 302 and dump channel switch 402, respectively, in accordance with respective pulse times of approximately 150 nanoseconds, 225 nanoseconds, 100 nanoseconds, and 300 nanoseconds.

The modulation cycle starts with the rise channel switch 202 turning on at time $t_1$ in response to the rise channel timing pulse shown in FIG. 2. A resonant charging of the output load capacitor 501 through rise channel inductor 203 then occurs during the rise channel 200 "on" time. Inherent losses prevent the output voltage at junction 16 from reaching the full $V_{cc}$ during the rise channel on time. This is an important feature since it prevents the magnetron from conducting (turning on) until the drive channel is switched on. The rise channel diode 204 prevents the output capacitor 501 from discharging back through the rise channel switch 202. Energy for the rise channel is provided by capacitor 25.

After the rise channel switch 202 turns off at time $t_2$, the second phase of modulation occurs when the drive channel switch 102 is switched on, also at time $t_2$, directly connecting the load (e.g., magnetron, shown as zener diode 503 with an appropriate series resistance 502 and parallel capacitance 501) to the high voltage supply $V_{cc}$. Output capacitor 501 is then charged an additional several hundred volts causing the load to conduct. Each of the channel switches, i.e., the drive channel switch 102, the rise channel switch 202, the fall channel switch 302, and the dump channel switch 402, has a series "on" resistance of a few ohms associated with it (i.e., drive channel resistor 101, rise channel resistor 201, fall channel resistor 301, and dump channel resistor 401, respectively). It is during the drive pulse time (i.e., time $t_2$ to time $t_3$ as shown in FIG. 2) that the load (e.g., magnetron) generates RF power.

The third phase of the modulation cycle occurs when the drive channel switch 102 switches off and the fall channel switch 302 is switched on at time $t_3$, causing a resonant discharge of the output load capacitor 501 through fall channel inductor 304. When the fall channel switch 302 is on, the fall channel diode 304 allows capacitor 25 to charge during the approximately 100 nanosecond fall channel timing. Capacitor 25 is thereby recharged to recycle energy to be used for the next modulation cycle.

Once the output signal has resonated down to a few hundred volts, the dump channel switch 402 switches on at time $t_4$, removing residual voltage on the load (e.g., magnetron). The dump channel 400 quickly reduces the voltage across the output 500 to near zero volts (electrical ground), thereby preventing the load (e.g., magnetron) from generating significant noise. Actual measurements have shown in the ARTS application that, to eliminate excessive noise during the interpulse period, the corresponding forward voltage across the magnetron cannot exceed 100 volts.

The stored energy represented by the charge on capacitor 25 is recycled during the next cycle's rise channel 200 on time, i.e., capacitor 25 partially charges output capacitor 501 when rise channel switch 202 is turned on during the next cycle. The energy recycling improves the pulse modulator's efficiency. In addition, the values for the components in the pulse modulator are chosen such that resonant charging and discharging occur. The modulator power dissipation was reduced in a preferred embodiment in accordance with the invention such that the resulting efficiency in modulating a magnetron source was about 70%.

The modulation output waveform is shown in FIG. 2. Times $t_1$, $t_2$, $t_3$, and $t_4$ correspond to the start of the pulse modulation phases for the rise channel, drive channel, fall channel, and dump channel, respectively. The pulse timing data for this particular embodiment of the invention is a rise channel pulse of 150 nanoseconds, a drive channel pulse of 225 nanoseconds, a fall channel pulse of 100 nanoseconds, and a dump channel pulse of 300 nanoseconds. The pulse timing need not be constrained to the values indicated for modulation to occur, but is used because of this particular ARTS application in a preferred embodiment of the invention.

Figure 3A:
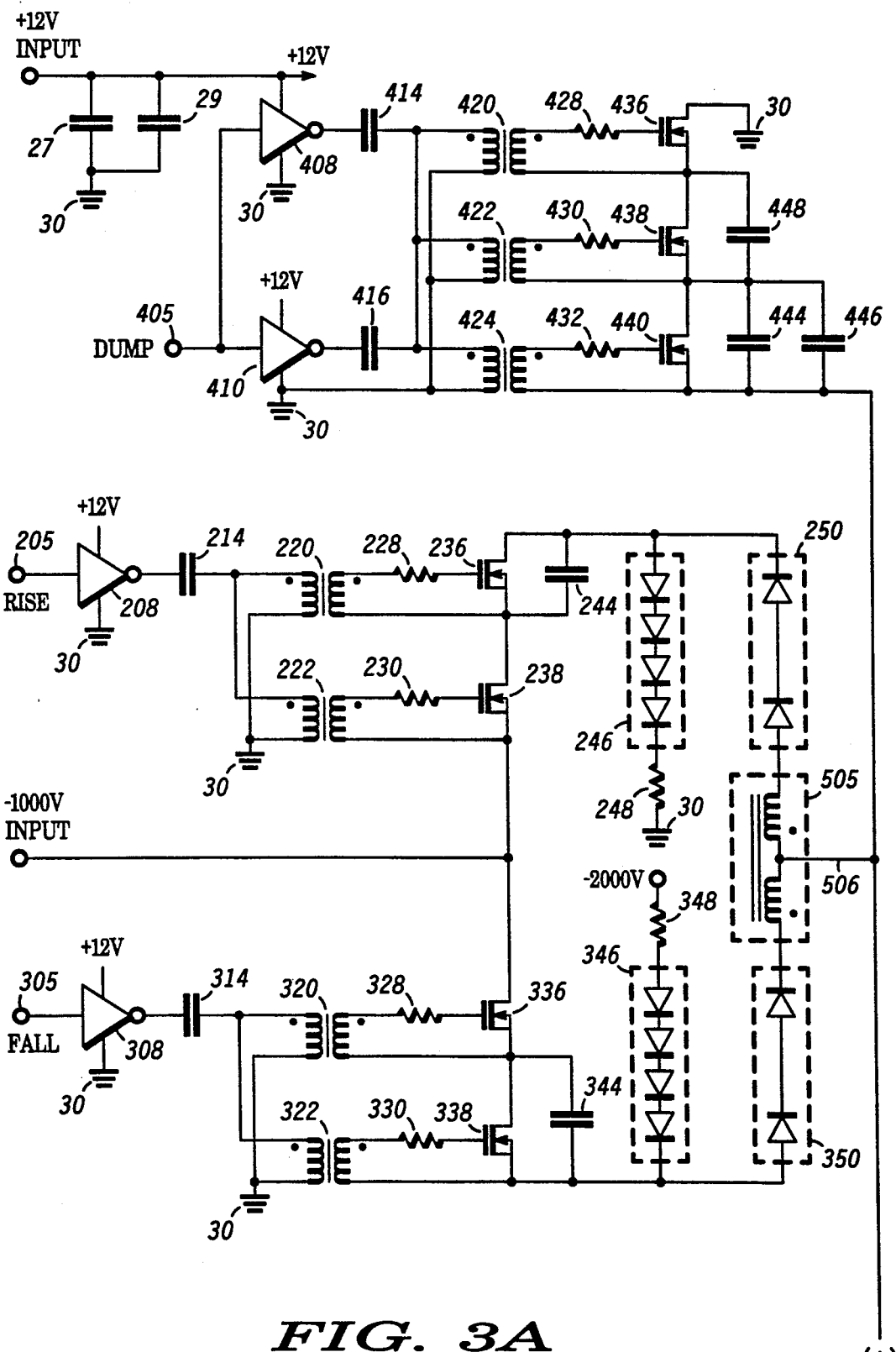
FIG. 3A and FIG. 3B show a detailed circuit schematic of the four-channel pulse modulator shown in FIG. 1.
Figure 3B:
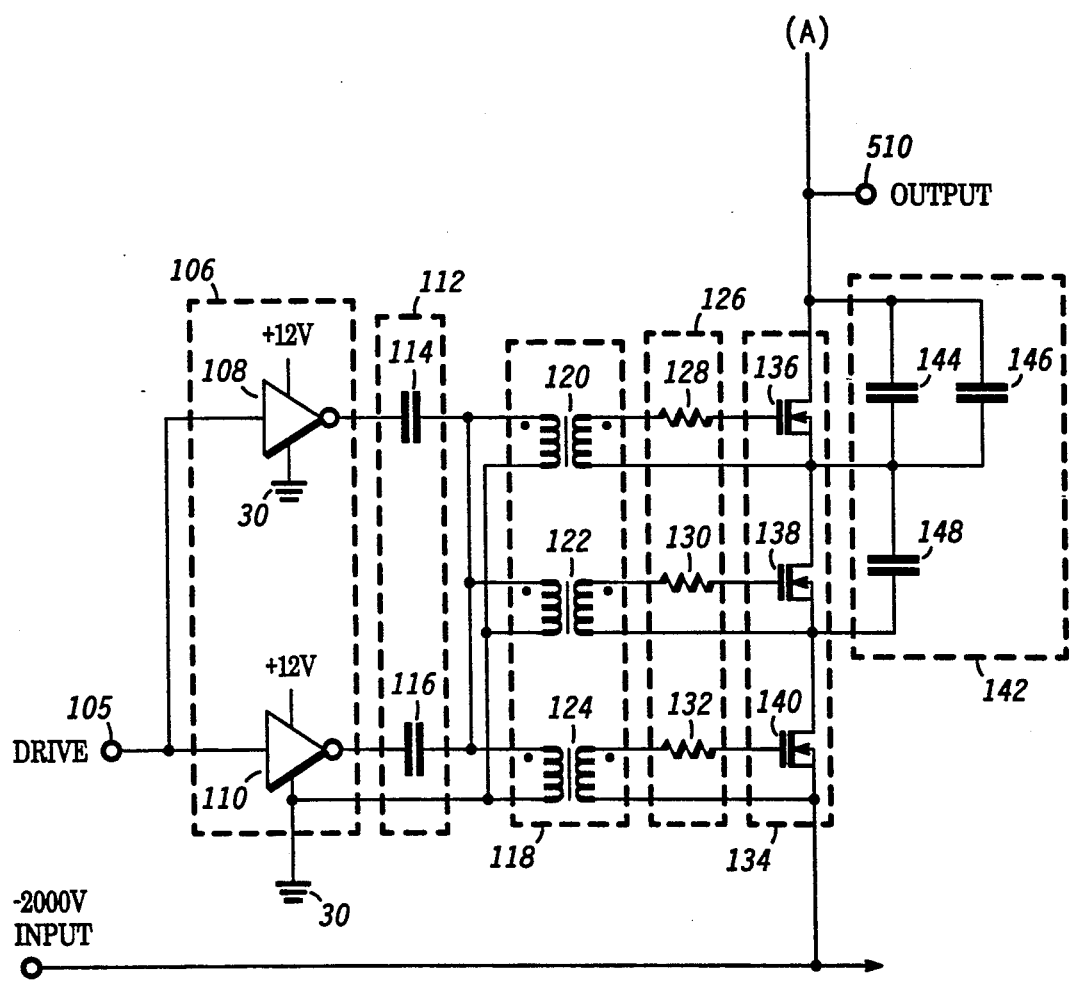

FIG. 3A and FIG. 3B show a detailed schematic implementing the four-channel pulse modulator shown in FIG. 1. The majority of components within each of the drive channel 100, rise channel 200, fall channel 300, and dump channel 400 are similar or identical, as described below.

In FIG. 3B, the drive channel input 105 is coupled to the drive channel amplifier (buffer) 106, which comprises drive channel amplifier 108 and drive channel amplifier 110. The function of drive channel amplifier 108 and drive channel amplifier 110 is to convert 0 to 5 V logic signals incident to the drive channel input 105 to 0 to 12 V signals to the remainder of the drive channel. AC coupling capacitors 112, comprising AC coupling capacitor 114 and AC coupling capacitor 116. AC coupling capacitor 114 and AC coupling capacitor 116 (for example, 0.1 microfarads each) are connected, respectively, between the output of drive channel amplifier 108 and the drive channel isolation pulse transformer stage 118 and the output of drive channel amplifier 110 and the drive channel isolation pulse transformer stage 118.

The outputs of capacitors 114 and 116 are connected together and to the parallel-connected primary windings of transformers 120, 122, and 124. The other primary winding connection of transformers 120, 122, and 124 are connected to electrical ground 30. Transformers 120, 122, and 124 comprise the drive channel isolation pulse transformer stage 118. The secondary windings of transformers 120, 122, and 124 are connected to resistors 128, 130, and 132, respectively, and to the sources of power field effect transistors (FETs) 136, 138, and 140, respectively. Resistors 128, 130, and 132 (for example, 4.7 ohms each) comprise the drive channel current limiting resistors 126 and resistors 128, 130, and 132 are also coupled, respectively, to the gates of FETs 136, 138, and 140.

The source of FET 140 is connected to the $-2000$ V input. The drain of FET 140 is coupled to the source of FET 138. The drain of FET 138 is coupled to the source of FET 136. The drain of FET 136 is coupled to the output 510. FETs 136, 138, and 140 comprise the drive channel switch stage 134.

Capacitors 144 (for example, 27 picofarads) and 146 (for example 33 picofarads) are coupled in parallel and the combination is coupled to the drain of FET 136 and the drain of FET 138. Capacitor 148 (for example, 18 picofarads) is coupled to the drain of FET 138 and the drain of FET 140. Capacitors 144, 146, and 148 comprise the drive channel voltage equalizing network 142, maintaining equal voltages on FETs 136, 138, and 140.

The high operating voltage across the drive channel 100 is accommodated by use of the voltage-equalized series-connected FETs 136, 138, and 140, because presently available MOSFETs are limited to 1000 V each. Three MOSFETs in series can safely operate at 667 V each to provide a 2000 volt capability, and capacitors 144, 146, and 148 provide dynamic voltage balancing. The necessity of using three MOSFETs 136, 138, and 140 necessitated use of multiple transformers 120, 122, and 124, capacitors 114 and 116, and drive channel amplifiers 108 and 110.

In operation, the timing data input into the drive channel 105, amplified in the drive channel amplifier (buffer) stage 106, and coupled to the drive channel AC coupling capacitors 112 before being applied to the drive channel isolation pulse transformer stage to serve as the input to the drive channel switch stage 134. When switched on, the drive channel switch stage 134 connects the −2000 V input to the output 510.

The structure, function, and component values of the rise channel 200, fall channel 300, and dump channel 400 in FIG. 3A are all analogous to the structure and function of the drive channel 100 in FIG. 3B. Functionally analogous components in FIG. 3A and FIG. 3B are labeled with the last two digits identical as between the channels, with a leading (hundred's) digit of 1 for the drive channel, 2 for the rise channel, 3 for the fall channel, and 4 for the dump channel. Thus, for example, each of the drive channel 100, rise channel 200, fall channel 300, and dump channel 400 has an input which is 105 for the drive channel, 205 for the rise channel, 305 for the fall channel, and 405 for the dump channel. As another example, each channel has power FETs for switching, comprising a switching stage. The switching stage for the drive channel comprises FETs 136, 138, and 140, the switching stage for the rise channel comprises FETs 236 and 238, the switching stage for the fall channel comprises FETs 336 and 338, and the switching stage for the dump channel comprises FETs 436, 438, and 440.

The rise channel 200 and the fall channel 300 have only two FETs in their switching stages because they are subject to only a −1000 V input, which occurs at the source of rise channel FET 238 and the drain of fall channel FET 336. The dump channel, like the drive channel, requires three FETs, namely FETs 436, 438, and 440, because it is subject to −2000 V input at the source of dump channel FET 440. A +12 V input, capacitively coupled to electrical ground 30 through both capacitors 27 and 29 (for example, 0.1 microfarads each) provides bias voltage filtering all channel amplifiers.

Other differences exist with respect to the rise channel 200 and fall channel 300 compared with the drive channel 100 and dump channel 400. Where the drive channel 100 and dump channel 400 connect directly from each switching stage to output 510, the rise channel 200 and fall channel 300 couple through separate resistor and diode networks to autotransformer 505.

Autotransformer 505 serves as the rise and fall inductances of FIG. 2's inductors 203 and 303. The drain of rise channel FET 236 is coupled to the anode of series diode network 246, the cathode of which is connected through resistor 248 to electrical ground 30. The drain of rise channel FET 236 also is coupled to the cathode of series diode network 250, the anode of which is connected to autotransformer 505. Similarly, the source of fall channel FET 338 is coupled to the cathode of series diode network 346, the anode of which is connected through resistor 348 to −2000 V. The source of fall channel FET 338 is also coupled to the anode of series diode network 350, the cathode of which is coupled to autotransformer 505. The center tap 506 of autotransformer 505 is coupled to the output 510. The diode-resistor networks 246-248 and 346-348 provide damping for any voltage overshoots which are inherent with any practical implementation of a circuit containing inductive components.

The entire modulator circuit can be constructed in an aluminum chassis using a printed wiring board for most of the components except for the diodes, which can be mounted on an aluminum nitride substrate attached to the chassis for good heat transfer. Power MOSFETs to do the switching can be mounted such that their leads attach to the circuit board, but so that their bodies can be heat sunk to the chassis along one side. A preferred embodiment of the modulator can be built within about 250 cubic centimeters (15 cubic inches).

Thus, a method and apparatus for high power pulse modulation has been described which overcomes specific problems and accomplishes certain advantages relative to prior art methods and mechanisms. The improvements over known technology are significant. The method and apparatus for high power pulse modulation can simultaneously achieve a high output power, high duty factor, high PRF, and high efficiency in pulse modulation. Only a single high voltage input is required for the modulator. The modulator and method allow time for recovery and produce waveforms of good fidelity. The modulator also produces low inter-pulse noise and can be constructed in a relatively small volume.

Thus, there has also been provided, in accordance with an embodiment of the invention, a method and apparatus for high power pulse modulation that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

I claim:

1. A high pulse repetition frequency (PRF), high power, four-channel pulse modulator comprising:

high voltage supply means for providing a high voltage input signal;

drive channel means for providing a drive channel component of an output signal coupled to the high voltage supply means;

rise channel means for providing a rise channel component of the output signal coupled to the high voltage supply means and to the drive channel means at a first junction;

fall channel means for providing a fall channel component of the output signal coupled to the high voltage supply means and to the rise channel means at the first junction;

output means for providing the output signal coupled between the first junction and the electrical ground;

dump channel means for providing a discharge path for the output means coupled between the first junction and an electrical ground; and timing means for modulating the high voltage input signal to produce the output signal coupled to the drive channel means, rise channel means, fall channel means, and dump channel means.

2. A modulator as claimed in claim 1, wherein the high voltage supply means comprises:
   high voltage source means;
   voltage divider means for reducing the high voltage input coupled between the high voltage source means and the electrical ground, the voltage divider means also coupled to the rise channel means, the fall channel means, and the drive channel means; and
   capacitive means to recycle electrical energy coupled between the voltage divider means and the electrical ground.

3. A modulator as claimed in claim 2, wherein the drive channel comprises:
   a drive channel logic input for receiving a drive channel logic signal;
   drive channel buffer amplifier means for amplifying the drive channel logic signal coupled to the drive channel logic input;
   drive channel AC coupling means for filtering the drive channel logic signal coupled to the drive channel buffer amplifier means;
   drive channel isolation pulse transformer means for providing a drive channel component of the output signal in response to the drive channel logic signal, the drive channel isolation pulse transformer means coupled to the drive channel AC coupling means;
   drive channel current limiting means for preventing an excess drive channel current coupled to the drive channel isolation pulse transformer means;
   drive channel switching means for engaging the drive channel component of the output signal coupled to the drive channel current limiting means; and
   drive channel voltage equalizing means for protecting the drive channel switching means coupled to the drive channel switching means, the drive channel for producing a drive channel component of the output signal.

4. A modulator as claimed in claim 3, wherein the drive channel switching means comprises at least one drive channel metal oxide semiconductor field effect transistor (MOSFET).

5. A modulator as claimed in claim 4, wherein the drive channel MOSFET comprises:
   a gate coupled to the drive channel current limiting means;
   a source coupled to the high voltage supply means; and
   a drain coupled to the output means.

6. A modulator as claimed in claim 2, wherein the dump channel comprises:
   a dump channel logic input for receiving a dump channel logic signal;
   dump channel buffer amplifier means for amplifying the dump channel logic signal coupled to the dump channel logic input;
   dump channel AC coupling means for filtering the dump channel logic signal coupled to the dump channel buffer amplifier means;
   dump channel isolation pulse transformer means for providing a dump channel component of the output signal in response to the dump channel logic signal, the dump channel isolation pulse transformer means coupled to the drive channel AC coupling means;
   dump channel current limiting means for preventing an excess dump channel current coupled to the dump channel isolation pulse transformer means;
   dump channel switching means for engaging the dump channel component of the output signal coupled to the drive channel current limiting means; and
   dump channel voltage equalizing means for protecting the dump channel switching means coupled to the dump channel switching means, the dump channel for producing a dump channel component of the output signal.

7. A modulator as claimed in claim 6, wherein the dump channel switching means comprises at least one dump channel metal oxide semiconductor field effect transistor (MOSFET).

8. A modulator as claimed in claim 7, wherein the dump channel MOSFET comprises:
   a gate coupled to the dump channel current limiting means;
   a source coupled to the output means; and
   a drain coupled to the electrical ground.

9. A modulator as claimed in claim 2, wherein the rise channel comprises:
   a rise channel logic input for receiving a rise channel logic signal;
   rise channel buffer amplifier means for amplifying the rise channel logic signal coupled to the rise channel logic input;
   rise channel AC coupling means for filtering the rise channel logic signal coupled to the rise channel buffer amplifier means;
   rise channel isolation pulse transformer means for providing a rise channel component of the output signal in response to the rise channel logic signal coupled to the drive channel AC coupling means;
   rise channel current limiting means for preventing an excess rise channel current coupled to the rise channel isolation pulse transformer means;
   rise channel switching means for engaging the drive channel component of the output signal coupled to the drive channel current limiting means; and
   rise channel voltage equalizing means for protecting the rise channel switching means coupled to the rise channel switching means;
   rise channel diode means coupled to the rise channel switching means; and
   rise channel inductive means coupled to the rise channel diode means and to the output means for producing a rise channel component of the modulation output signal.

10. A modulator as claimed in claim 9, wherein the rise channel switching means comprises at least one rise channel metal oxide semiconductor field effect transistor (MOSFET).

11. A modulator as claimed in claim 10, wherein the rise channel MOSFET comprises:
   a gate coupled to the rise channel current limiting means;
   a source coupled to the high voltage supply means; and
   a drain coupled to the output means.

12. A modulator as claimed in claim 2, wherein the fall channel comprises:
   a fall channel logic input for receiving a fall channel logic signal;
   fall channel buffer amplifier means for amplifying a fall channel logic signal coupled to the fall channel logic input;

fall channel AC coupling means for filtering the fall channel logic signal coupled to the fall channel buffer amplifier means;

fall channel isolation pulse transformer means for providing a fall channel component of the output signal in response to the fall channel logic signal coupled to the drive channel AC coupling means;

fall channel current limiting means for preventing an excess fall channel current coupled to the fall channel isolation pulse transformer means;

fall channel switching means for engaging the fall channel component of the output signal coupled to the drive channel current limiting means; and fall channel voltage equalizing means for protecting the fall channel switching means coupled to the fall channel switching means;

fall channel diode means coupled to the fall channel switching means; and fall channel inductive means coupled to the rise channel inductor means and to the output means for producing a fall channel component of the modulation output signal.

13. A modulator as claimed in claim 12, wherein the fall channel switching means comprises at least one fall channel metal oxide semiconductor field effect transistor (MOSFET).

14. A modulator as claimed in claim 13, wherein the fall channel MOSFET comprises:
- a gate coupled to the fall channel current limiting means;
- a source coupled to the output means; and
- a drain coupled to the high voltage supply means.

15. A four-channel, high pulse repetition frequency (PRF), magnetron modulator comprising:
- high voltage supply means for providing a high voltage input signal;
- drive channel means for providing a drive channel component of an output signal coupled to the high voltage supply means;
- rise channel means for providing a rise channel component of the output signal coupled to the high voltage supply means and to the drive channel means at a first junction;
- fall channel means for providing a fall channel component of the output signal coupled to the high voltage supply means and to the rise channel means at the first junction;
- output means for providing the output signal coupled between the first junction and the electrical ground;
- dump channel means for providing a discharge path for the output means coupled between the first junction and an electrical ground; and
- timing means for modulating the high voltage input signal to produce the output signal coupled to the drive channel means, rise channel means, fall channel means, and dump channel means.

16. A magnetron modulator as claimed in claim 15, wherein the high voltage supply means comprises:
- high voltage source means;
- voltage divider means for reducing the high voltage input coupled between the high voltage source means and the electrical ground, the voltage divider means also coupled to the rise channel means, the fall channel means, and the drive channel means; and
- capacitive means to recycle electrical energy coupled between the voltage divider means and the electrical ground.

17. A magnetron modulator as claimed in claim 16, wherein the drive channel comprises:
- a drive channel logic input for receiving a drive channel logic signal;
- drive channel buffer amplifier means for amplifying the drive channel logic signal coupled to the drive channel logic input;
- drive channel AC coupling means for filtering the drive channel logic signal coupled to the drive channel buffer amplifier means;
- drive channel isolation pulse transformer means for providing a drive channel component of the output signal in response to the drive channel logic signal, the drive channel isolation pulse transformer means coupled to the drive channel AC coupling means;
- drive channel current limiting means for preventing an excess drive channel current coupled to the drive channel isolation pulse transformer means;
- drive channel switching means for engaging the drive channel component of the output signal coupled to the drive channel current limiting means; and
- drive channel voltage equalizing means for protecting the drive channel switching means coupled to the drive channel switching means, the drive channel for producing a drive channel component of the output signal.

18. A magnetron modulator as claimed in claim 17, wherein the drive channel switching means comprises at least one drive channel metal oxide semiconductor field effect transistor (MOSFET).

19. A magnetron modulator as claimed in claim 18, wherein the drive channel MOSFET comprises:
- a gate coupled to the drive channel current limiting means;
- a source coupled to the high voltage supply means; and
- a drain coupled to the output means.

20. A magnetron modulator as claimed in claim 16, wherein the dump channel comprises:
- a dump channel logic input for receiving a dump channel logic signal;
- dump channel buffer amplifier means for amplifying the dump channel logic signal coupled to the dump channel logic input;
- dump channel AC coupling means for filtering the dump channel logic signal coupled to the dump channel buffer amplifier means;
- dump channel isolation pulse transformer means for providing a dump channel component of the output signal in response to the dump channel logic signal, the dump channel isolation pulse transformer means coupled to the drive channel AC coupling means;
- dump channel current limiting means for preventing an excess dump channel current coupled to the dump channel isolation pulse transformer means;
- dump channel switching means for engaging the dump channel component of the output signal coupled to the drive channel current limiting means; and
- dump channel voltage equalizing means for protecting the dump channel switching means coupled to the dump channel switching means, the dump channel for producing a dump channel component of the output signal.

21. A magnetron modulator as claimed in claim 20, wherein the dump channel switching means comprises at least one dump channel metal oxide semiconductor field effect transistor (MOSFET).

22. A magnetron modulator as claimed in claim 21, wherein the dump channel MOSFET comprises:
   a gate coupled to the dump channel current limiting means;
   a source coupled to the output means; and
   a drain coupled to the electrical ground.

23. A magnetron modulator as claimed in claim 16, wherein the rise channel comprises:
   a rise channel logic input for receiving a rise channel logic signal;
   rise channel buffer amplifier means for amplifying the rise channel logic signal coupled to the rise channel logic input;
   rise channel AC coupling means for filtering the rise channel logic signal coupled to the rise channel buffer amplifier means;
   rise channel isolation pulse transformer means for providing a rise channel component of the output signal in response to the rise channel logic signal coupled to the drive AC coupling means;
   rise channel current limiting means for preventing an excess rise channel current coupled to the rise channel isolation pulse transformer means;
   rise channel switching means for engaging the drive channel component of the output signal coupled to the drive channel current limiting means; and
   rise channel voltage equalizing means for protecting the rise channel switching means coupled to the rise channel switching means;
   rise channel diode means coupled to the rise channel switching means; and
   rise channel inductive means coupled to the rise channel diode means and to the output means for producing a rise channel component of the modulation output signal.

24. A magnetron modulator as claimed in claim 23, wherein the rise channel switching means comprises at least one rise channel metal oxide semiconductor field effect transistor (MOSFET).

25. A magnetron modulator as claimed in claim 24, wherein the rise channel MOSFET comprises:
   a gate coupled to the rise channel current limiting means;
   a source coupled to the high voltage supply means; and
   a drain coupled to the output means.

26. A magnetron modulator as claimed in claim 16, wherein the fall channel comprises:
   a fall channel logic input for receiving a fall channel logic signal;
   fall channel buffer amplifier means for amplifying a fall channel logic signal coupled to the fall channel logic input;
   fall channel AC coupling means for filtering the fall channel logic signal coupled to the fall channel buffer amplifier means;
   fall channel isolation pulse transformer means for providing a fall channel component of the output signal in response to the fall channel logic signal coupled to the drive channel AC coupling means;
   fall channel current limiting means for preventing an excess fall channel current coupled to the fall channel isolation pulse transformer means;
   fall channel switching means for engaging the fall channel component of the output signal coupled to the drive channel current limiting means; and
   fall channel voltage equalizing means for protecting the fall channel switching means coupled to the fall channel switching means;
   fall channel diode means coupled to the fall channel switching means; and
   fall channel inductive means coupled to the rise channel inductor means and to the output means for producing a fall channel component of the modulation output signal.

27. A magnetron modulator as claimed in claim 26, wherein the fall channel switching means comprises at least one fall channel metal oxide semiconductor field effect transistor (MOSFET).

28. A magnetron modulator as claimed in claim 27, wherein the fall channel MOSFET comprises:
   a gate coupled to the fall channel current limiting means;
   a source coupled to the output means; and
   a drain coupled to the high voltage supply means.

29. A method for modulating a high voltage signal in a four-channel pulse modulator, comprising the steps of:
   inputting the high voltage signal to a drive channel;
   voltage dividing the high voltage signal;
   inputting the voltage divided high voltage signal to a rise channel and a fall channel;
   providing a dump channel;
   providing a rise channel timing pulse, drive channel timing pulse, fall channel timing pulse, and dump channel timing pulse to switch the rise channel, drive channel, fall channel, and dump channels, respectively; and
   switching the rise channel, drive channel, fall channel, and dump channel to modulate the high voltage signal.

30. The method for modulating a high voltage signal as claimed in claim 29, wherein the step of switching the rise channel, drive channel, fall channel, and dump channel to modulate the high voltage signal comprises the steps of:
   switching the rise channel on to resonantly partially charge a load capacitance;
   switching the rise channel off;
   switching the drive channel on to resonantly completely charge the load capacitance and drive the load;
   switching the drive channel off;
   switching the fall channel on to partially discharge the load capacitance;
   switching the fall channel off;
   switching the dump channel on to completely discharge the load capacitance; and
   switching the dump channel off.

31. The method for modulating a high voltage signal as claimed in claim 30 wherein the step of switching the rise channel, drive channel, fall channel, and dump channel to modulate the high voltage signals repeated.

32. The method for modulating a high voltage signal as claimed in claim 31 wherein the step of switching the rise channel, drive channel, fall channel, and dump channel to modulate the high voltage signal further comprises recycling an electrical energy of the discharge of the source capacitance to charge the source capacitance on a repetition of switching.

* * * * *